(12) United States Patent
Lu

(10) Patent No.: US 10,719,157 B2
(45) Date of Patent: Jul. 21, 2020

(54) DISPLAY PANEL AND DISPLAY MODULE

(71) Applicant: WUHAN CHINA STAR OPTOELECTRONICS TECHNOLOGY CO., LTD., Wuhan, Hubei (CN)

(72) Inventor: Yantao Lu, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/327,829

(22) PCT Filed: Dec. 15, 2018

(86) PCT No.: PCT/CN2018/121360
§ 371 (c)(1),
(2) Date: Feb. 24, 2019

(65) Prior Publication Data
US 2020/0133420 A1    Apr. 30, 2020

(30) Foreign Application Priority Data
Oct. 31, 2018 (CN) .......................... 2018 1 1290146

(51) Int. Cl.
*G06F 3/041* (2006.01)
*H01L 25/18* (2006.01)
*H01L 27/12* (2006.01)

(52) U.S. Cl.
CPC ........ *G06F 3/0412* (2013.01); *G06F 3/04164* (2019.05); *H01L 25/18* (2013.01); *H01L 27/124* (2013.01)

(58) Field of Classification Search
CPC ... G06F 3/0412; G06F 3/04164; H01L 25/18; H01L 27/124
See application file for complete search history.

(56) References Cited

U.S. PATENT DOCUMENTS

| 2008/0067510 A1* | 3/2008 | Tsai | G02F 1/1345 257/59 |
| 2015/0294988 A1* | 10/2015 | Hsieh | H01L 27/124 257/72 |
| 2019/0361553 A1* | 11/2019 | Yin | G06F 3/0412 |

* cited by examiner

*Primary Examiner* — Andrew Sasinowski
(74) *Attorney, Agent, or Firm* — Mark M. Friedman

(57) ABSTRACT

A display panel and a display module are provided. The display panel includes a display area, a driving chip on a side of the display area, and a fan-out wiring area connecting the display area and the driving chip. The driving chip includes a first side and two second sides respectively connected perpendicularly to both ends of the first side. The fan-out wiring area includes a plurality of first fan-out traces connected to the first side and a plurality of second fan-out traces respectively connected to the two second sides. A part of signals in the driving chip can be transmitted from the second sides of the driving chip to the display area through the second fan-out traces. This increases a total width of the fan-out wiring area and a trace width in the fan-out wiring area, avoids a risk of wire breakage, and reduces an impedance of the traces.

14 Claims, 2 Drawing Sheets

DISPLAY PANEL AND DISPLAY MODULE

FIELD OF INVENTION

The present disclosure relates to the field of display technologies, and more particularly to a display panel and a display module.

BACKGROUND OF INVENTION

Thin film transistors (TFTs) are main driving components in current liquid crystal displays (LCDs) and active matrix organic light emitting diodes (AMOLEDs), and are directly related to a display performance of flat panel display devices.

Most of liquid crystal displays on the current market are backlight type liquid crystal displays, which include a liquid crystal display panel and a backlight module. Working principle of the liquid crystal display panel is to fill liquid crystal molecules between a TFT array substrate) and a color filter (CF) substrate, apply a pixel voltage and a common voltage on the two substrates respectively, and control a rotation direction of the liquid crystal molecules by an electric field formed between the pixel voltage and the common voltage to transmit light of the backlight module to generate a picture.

According to different structures, touch display panels can be divided into on-cell type touch display panels, in-cell type touch display panels, and externally-attached type touch display panels. The externally-attached type touch display panels are to make a touch sensor on a surface of a color filter, and the touch sensor is added with glass to form a touch panel module, and then a liquid crystal panel module is attached. The in-cell type touch display panels are formed by a touch sensor in a panel structure, and the touch sensor is directly placed in a thin film transistor liquid crystal display panel module, and a touch function is integrated in a display, such that a touch panel does not need to be externally mounted, a thickness thereof is also lighter and thinner than a thickness of an externally-attached type touch panel, which can effectively avoid an adverse effect of the externally-attached type touch panel on optical characteristics and a thickness of the panel. Due to an increasing of a display screen ration, a lower border of a display panel is getting smaller and smaller, and a space of a metal fan-out traces of output pins of the panel connected to an interlace IC and touch signal lines and data signal lines of a display area (active area, AA) is reduced. (Interlaced integrated chip refers to a type of IC with embedded touch drive function. The order of output pins of this type of IC is that output pins of data signals and output pins of touch signals are alternately wired according to a certain rule.) This leads to a reduction in a line width of the metal fan-out traces, which is liable to cause metal fan-out wire breakage and affect the panel touch function.

SUMMARY OF INVENTION

An object of the present disclosure provides a display panel capable of increasing a trace width in a fan-out wiring area, avoiding a risk of wire breakage, and reducing an impedance of traces.

An object of the present disclosure further provides a display module capable of increasing a trace width in a fan-out wiring area, avoiding a risk of wire breakage, and reducing an impedance of traces.

To achieve the above object, the present disclosure provides a display panel. The display panel includes a display area, a driving chip positioned on a side of the display area, and a fan-out wiring area connecting the display area and the driving chip. The driving chip includes a first side and two second sides respectively connected perpendicularly to both ends of the first side. The lan-out wiring area includes a plurality of first fan-out traces connected to the first side and a plurality of second fan-out traces respectively connected to the two second sides.

In an embodiment of the present disclosure, the driving chip includes a plurality of first internal traces extending toward the first side and a plurality of second internal traces extending respectively to the two second sides, the first fan-out traces are connected in one-to-one correspondence with the first internal traces, and the second fan-out traces are connected in one-to-one correspondence with the second internal traces.

In an embodiment of the present disclosure, the driving chip is provided with a plurality of output pins arranged along an extending direction of the first side, and the output pins are respectively connected to the first internal traces and the second internal traces.

In an embodiment of the present disclosure, a portion of the output pins adjacent to the two second sides are connected to the second internal traces.

In an embodiment of the present disclosure, the output pins include a plurality of mutually parallel data signal output pins and a plurality of mutually parallel touch signal output pins, the data signal output pins and the touch signal output pins are arranged in two rows, and the data signal output pins and the touch signal output pin are alternately arranged.

In an embodiment of the present disclosure, the first fan-out traces and the second fan-out traces respectively connect a plurality of signal lines in the display area, the signal lines include a plurality of data signal traces and a plurality of touch signal traces, the driving chip transmits a data signal to the data signal traces through the data signal output pins, the driving chip transmits a touch signal to the touch signal traces through the touch signal output pins.

In an embodiment of the present disclosure, each of the data signal output pins transmits one kind of data signal, and each of the touch signal output pins transmits one kind of touch signal.

In an embodiment of the present disclosure, a length of each of the second fan-out traces is greater than a length of each of the first fan-out traces.

In an embodiment of the present disclosure, an impedance of each of the second internal traces is less than an impedance of each of the first internal traces.

The present disclosure also provides a display module including the above display panel.

Beneficial effects of the embodiment of the present disclosure: the display panel of the embodiment includes a display area, a driving chip on a side of the display area, and a fan-out wiring area connecting the display area and the driving chip. The driving chip includes a first side and two second sides respectively connected perpendicularly to both ends of the first side. The fan-out wiring area includes a plurality of first fan-out traces connected to the first side and a plurality of second fan-out traces respectively connected to the two second sides. A part of signals in the driving chip can be transmitted from the two second sides of the driving chip to the display area through the second fan-out traces. This increases a total width of the fan-out wiring area and a trace width in the fan-out wiring area, avoids a risk of wire breakage, and reduces an impedance of the traces. The display module of the embodiment can increase a total width of the fan-out wiring area and a trace width in the fan-out wiring area, avoid a risk of wire breakage, and reduce an impedance of the traces.

DESCRIPTION OF DRAWINGS

In order to further understand the features and technical contents of the present disclosure, please refer to the following detailed description and drawings related to the present disclosure. The drawings are provided for the purpose of illustration and description only, and are not intended to limit the present disclosure.

DETAILED DESCRIPTION OF PREFERRED EMBODIMENTS

In order to further clarify the technical means and effects of the present disclosure, the following detailed description will be made in conjunction with the preferred embodiments of the present disclosure and the accompanying drawings.

Figure 1:
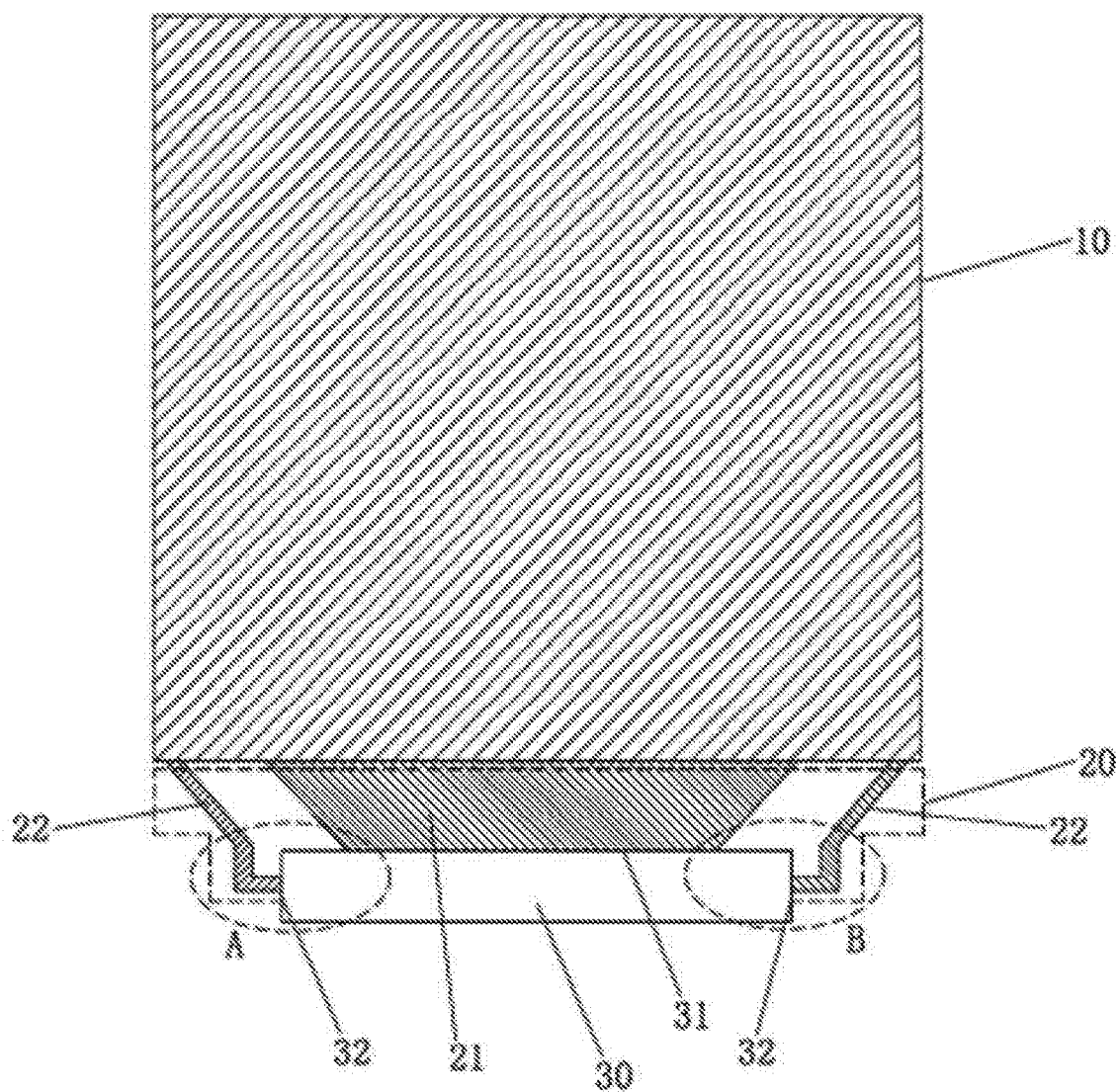
FIG. 1 is a schematic structural view of a display panel according to an embodiment of the present disclosure.
Figure 2:
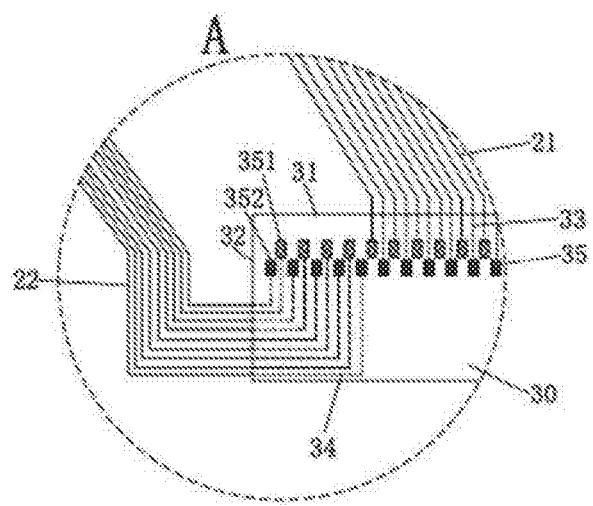
FIG. 2 is an enlarged schematic view illustrating a portion A of a display panel according to an embodiment of the present disclosure.
Figure 3:
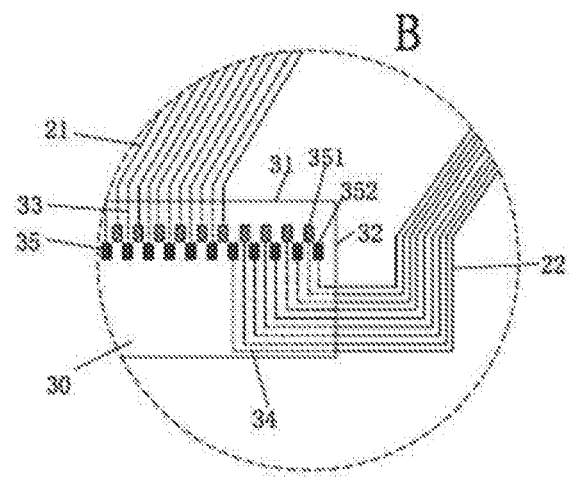
FIG. 3 is an enlarged schematic view illustrating a portion B of a display panel according to an embodiment of the present disclosure.

Referring to FIG. 1 to FIG. 3, an embodiment of the present disclosure provides a display panel. The display panel includes a display area 10, a driving chip 30 positioned on a side of the display area 10, and a fan-out wiring area 20 connecting the display area 10 and the driving chip 30. The driving chip 30 includes a first side 31 and two second sides 32 respectively connected perpendicularly to both ends of the first side 31. The fan-out wiring area 20 includes a plurality of first fan-out traces 21 connected to the first side 31 and a plurality of second fan-out traces 22 respectively connected to the two second sides 32.

It is understood that the driving chip 30 of the present disclosure includes the first side 31 and the two second sides 32 respectively connected perpendicularly to the both ends of the first side 31. The first side 31 is corresponding to the display area 10. The fan-out wiring area 20 includes the first fan-out traces 21 connected to the first side 31 and the second fan-out traces 22 respectively connected to the two second sides 32. A part of signals in the driving chip 30 can be transmitted from the two second sides 32 of the driving chip 30 to the display area 10 through the second fan-out traces 22. This increases a total width of the fan-out wiring area 20 and a trace width in the fan-out wiring area 20, avoids a risk of wire breakage, and reduces an impedance of the traces.

In details, the driving chip 30 includes a plurality of first internal traces 33 extending toward the first side 31 and a plurality of second internal traces 34 extending respectively to the two second sides 32, the first fan-out traces 21 are connected in one-to-one correspondence with the first internal traces 33, and the second fan-out traces 22 are connected in one-to-one correspondence with the second internal traces 34.

In details, the driving chip 30 is provided with a plurality of output pins 35 arranged along an extending direction of the first side 31, and the output pins 35 are respectively connected to the first internal traces 33 and the second internal traces 34.

In details, a portion of the output pins 35 adjacent to the two second sides 32 are connected to the second internal traces 34. The remaining output pins 35 are connected to the first internal traces 33.

In details, the output pins 35 include a plurality of mutually parallel data signal output pins 351 and a plurality of mutually parallel touch signal output pins 352, the data signal output pins 351 and the touch signal output pins 352 are arranged in two rows, and the data signal output pins 351 and the touch signal output pin 352 are alternately arranged.

In details, the first fan-out traces 21 and the second fan-out traces 22 respectively connect a plurality of signal lines in the display area 10, the signal lines include a plurality of data signal traces and a plurality of touch signal traces.

In details, the driving chip 30 transmits a data signal to the data signal traces through the data signal output pins 351, the driving chip 30 transmits a touch signal to the touch signal traces through the touch signal output pins 351.

In details, each of the traces of the fan-out wiring area 20 transmits only one kind of data signal or one kind of touch signal, that is, each of the data signal output pins 351 transmits one kind of data signal, and each of the touch signal output pins 352 transmits one kind of touch signal.

In details, as relative positions of the driving chip 30 and corresponding data signal traces are different, or relative positions of the driving chip 30 and the corresponding touch signal traces are different, each of the traces of the fan-out wiring area 20 has a different length. That is, a length of each of the second fan-out traces 22 is greater than a length of each of the first fan-out traces 21. The longer the impedance is, the larger the impedance is. Therefore, the driving chip 30 of the present disclosure uses a plurality of second internal traces 34 having a small impedance, that is, an impedance of each of the second internal traces 34 is less than an impedance of each of the first internal traces 33.

Based on the above display panel, the present disclosure also provides a display module including the above display panel.

In summary, the display panel of the embodiment of the present disclosure includes a display area, a driving chip on a side of the display area, and a fan-out wiring area connecting the display area and the driving chip. The driving chip includes a first side and two second sides respectively connected perpendicularly to both ends of the first side. The fan-out wiring area includes a plurality of first fan-out traces connected to the first side and a plurality of second fan-out traces respectively connected to the two second sides. A part of signals in the driving chip can be transmitted from the two second sides of the driving chip to the display area through the second fan-out traces. This increases a total width of the fan-out wiring area and a trace width in the fan-out wiring area, avoids a risk of wire breakage, and reduces an impedance of the traces. The display module of the embodiment of the present disclosure can increase a total width of the fan-out wiring area and a trace width in the fan-out wiring area, avoid a risk of wire breakage, and reduce an impedance of the traces.

In summary, various changes and modifications can be made by those skilled in the art according to the technical solutions and technical concepts of the present disclosure, and these changes and modifications should be encompassed within the protection scope of the present disclosure.

What is claimed is:

1. A display panel, comprising:
   a display area;
   a driving chip positioned on a side of the display area; and
   a fan-out wiring area connecting the display area and the driving chip;
   wherein the driving chip comprises a first side and two second sides respectively connected perpendicularly to both ends of the first side;
   wherein the fan-out wiring area comprises a plurality of first fan-out traces connected to the first side and a plurality of second fan-out traces respectively connected to the two second sides;
   wherein the driving chip is provided with a plurality of output pins arranged along an extending direction of the first side, and the output pins are respectively connected to the first internal traces and the second internal traces;
   wherein the output pins comprise a plurality of mutually parallel data signal output pins and a plurality of mutually parallel touch signal output pins, the data signal output pins and the touch signal output pins are arranged in two rows, and the data signal output pins and the touch signal output pin are alternately arranged.

2. The display panel according to claim 1, wherein the driving chip comprises a plurality of first internal traces extending toward the first side and a plurality of second internal traces extending respectively to the two second sides, the first fan-out traces are connected in one-to-one correspondence with the first internal traces, and the second fan-out traces are connected in one-to-one correspondence with the second internal traces.

3. The display panel according to claim 2, wherein an impedance of each of the second internal traces is less than an impedance of each of the first internal traces.

4. The display panel according to claim 1, wherein a portion of the output pins adjacent to the two second sides are connected to the second internal traces.

5. The display panel according to claim 1, wherein the first fan-out traces and the second fan-out traces respectively connect a plurality of signal lines in the display area, the signal lines comprise a plurality of data signal traces and a plurality of touch signal traces, the driving chip transmits a data signal to the data signal traces through the data signal output pins, the driving chip transmits a touch signal to the touch signal traces through the touch signal output pins.

6. The display panel according to claim 5, wherein each of the data signal output pins transmits one kind of data signal, and each of the touch signal output pins transmits one kind of touch signal.

7. The display panel according to claim 1, wherein a length of each of the second fan-out traces is greater than a length of each of the first fan-out traces.

8. A display module comprising a display panel, the display panel comprising:
   a display area;
   a driving chip positioned on a side of the display area; and
   a fan-out wiring area connecting the display area and the driving chip;
   wherein the driving chip comprises a first side and two second sides respectively connected perpendicularly to both ends of the first side;
   wherein the fan-out wiring area comprises a plurality of first fan-out traces connected to the first side and a plurality of second fan-out traces respectively connected to the two second sides;
   wherein the driving chip is provided with a plurality of output pins arranged along an extending direction of the first side, and the output pins are respectively connected to the first internal traces and the second internal traces;
   wherein the output pins comprise a plurality of mutually parallel data signal output pins and a plurality of mutually parallel touch signal output pins, the data signal output pins and the touch signal output pins are arranged in two rows, and the data signal output pins and the touch signal output pin are alternately arranged.

9. The display module according to claim 8, wherein the driving chip comprises a plurality of first internal traces extending toward the first side and a plurality of second internal traces extending respectively to the two second sides, the first fan-out traces are connected in one-to-one correspondence with the first internal traces, and the second fan-out traces are connected in one-to-one correspondence with the second internal traces.

10. The display module according to claim 9, wherein an impedance of each of the second internal traces is less than an impedance of each of the first internal traces.

11. The display module according to claim 8, wherein a portion of the output pins adjacent to the two second sides are connected to the second internal traces.

12. The display module according to claim 8, wherein the first fan-out traces and the second fan-out traces respectively connect a plurality of signal lines in the display area, the signal lines comprise a plurality of data signal traces and a plurality of touch signal traces, the driving chip transmits a data signal to the data signal traces through the data signal output pins, the driving chip transmits a touch signal to the touch signal traces through the touch signal output pins.

13. The display module according to claim 12, wherein each of the data signal output pins transmits one kind of data signal, and each of the touch signal output pins transmits one kind of touch signal.

14. The display module according to claim 8, wherein a length of each of the second fan-out traces is greater than a length of each of the first fan-out traces.

* * * * *